United States Patent  [10] Patent No.: US 8,293,644 B2
Jang et al.  [45] Date of Patent: Oct. 23, 2012

(54) METHODS OF MANUFACTURING A SEMICONDUCTOR MEMORY DEVICE

(75) Inventors: Se-myeong Jang, Anyang-si (KR); Min-sung Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 419 days.

(21) Appl. No.: 12/656,969

(22) Filed: Feb. 22, 2010

(65) Prior Publication Data

US 2011/0053369 A1    Mar. 3, 2011

(30) Foreign Application Priority Data

Aug. 26, 2009   (KR) .................. 10-2009-0079317

(51) Int. Cl.
*H01L 21/44* (2006.01)
*H01L 21/4763* (2006.01)

(52) U.S. Cl. ........ 438/675; 438/589; 438/626; 438/631; 438/637; 438/638; 438/640; 438/673; 257/300; 257/304; 257/311; 257/532; 257/E21.577; 257/E21.578; 257/E21.579; 257/E21.58

(58) Field of Classification Search .......... 257/E21.577–E21.58, 300, 304, 311, 531; 438/589, 626, 438/631, 637–640, 675, 673
See application file for complete search history.

(56) References Cited

U.S. PATENT DOCUMENTS

| 6,207,579 | B1 | 3/2001 | Chen | |
|---|---|---|---|---|
| 6,376,380 | B1* | 4/2002 | Tang et al. | 438/692 |
| 7,002,199 | B2* | 2/2006 | Fukuzumi | 257/296 |
| 2004/0084709 | A1* | 5/2004 | Kim et al. | 257/306 |
| 2004/0161923 | A1* | 8/2004 | Bae et al. | 438/633 |
| 2009/0108461 | A1* | 4/2009 | Kang | 257/774 |

FOREIGN PATENT DOCUMENTS

| JP | 10-178160 | 6/1998 |
|---|---|---|
| KR | 10-0685677 | 2/2007 |

OTHER PUBLICATIONS

Abstract of KR 10-2006-0029006, Apr. 4, 2006, Korea.

* cited by examiner

*Primary Examiner* — Kimberly Rizkallah
*Assistant Examiner* — Maria Ligai
(74) *Attorney, Agent, or Firm* — Harness, Dickey & Pierce, P.L.C.

(57) ABSTRACT

Methods of forming a semiconductor include forming an insulation layer over a semiconductor substrate in which a first region and a second region are defined. A storage node contact (SNC) that passes through the insulation layer is formed and is electrically connected to the first region. A conductive layer that passes through the insulation layer is deposited and is electrically connected to the second region on the insulation layer and the SNC. A bit line is formed by removing an upper portion of the conductive layer, an upper portion of the insulation layer and an upper portion of the SNC until the SNC and the conductive layer are electrically separated from each other, wherein the bit line is a remaining part of the conductive layer.

13 Claims, 13 Drawing Sheets

METHODS OF MANUFACTURING A SEMICONDUCTOR MEMORY DEVICE

CROSS-REFERENCE TO RELATED APPLICATIONS

This application claims the benefit of priority under 35 U.S.C. §119 from Korean Patent Application No. 10-2009-0079317, filed on Aug. 26, 2009, in the Korean Intellectual Property Office, the disclosure of which is incorporated herein in its entirety by reference.

BACKGROUND

1. Field

The inventive concepts relate to methods of manufacturing a semiconductor memory device, and more particularly, to methods of forming a bit line and a storage node contact (SNC) of a semiconductor memory device.

2. Description of Related Art

As the functionality of a microprocessor becomes more powerful and a software program of the microprocessor becomes more complex, demand for larger capacity dynamic random access memory (DRAM) accordingly increases. An increase in the integration of DRAM results in a reduction in the size of a DRAM capacitor. The surface area of the DRAM capacitor necessarily increases in order to maintain capacitance of the DRAM capacitor. Thus, stack type capacitors have been developed.

With respect to a capacitor over bit line (COB) (which is a stack type capacitor), an increase in the integration of the DRAM results in a reduction of an overlay margin between a storage node contact (SNC) and a bit line. Such a reduction makes it difficult to form the SNC and a bit line.

SUMMARY

The inventive concepts relate to methods of manufacturing a semiconductor memory device, and more particularly, to methods of forming a bit line and a storage node contact (SNC) of a semiconductor memory device.

The inventive concepts provide methods of manufacturing a semiconductor memory device exhibiting an increase in the bridge characteristics of a bit line and a storage node contact (SNC), a decrease in a loading capacitance of the bit line, and a decrease in the entire height of the semiconductor memory device.

According to an example embodiments of the inventive concepts, there is provided a method of manufacturing a semiconductor memory device, the method including forming a first insulation layer on a semiconductor substrate in which a first region and a second region are defined; forming a bit line contact on the second region through the first insulation layer; and forming a second insulation layer on the first insulation layer and the bit line contact. The second insulation layer and the first insulation layer are patterned such that the first region is exposed. A first conductive layer is deposited on the first region and the second insulation layer. A storage node contact (SNC), which is electrically connected to the first region by removing an upper portion of the first conductive layer, is formed until (or such that) the second insulation layer is exposed. The second insulation layer is patterned such that (or until) the bit line contact is exposed. A second conductive layer is deposited on the bit line contact, the SNC and the second insulation layer. A bit line, which is electrically connected to the second region through the bit line contact, is formed by removing an upper portion of the second conductive layer until (or such that) the SNC and the second insulation layer are exposed.

The semiconductor substrate may include an active region comprising the first region and the second region; a device isolation layer that defines the active region; and a gate line that is recessed into the active region of the device isolation layer and passes between the first region and the second region.

The semiconductor substrate may include an active region comprising a first impurity region and a second impurity region; a device isolation layer that defines the active region; a gate line that is formed on the active region of the device isolation layer and passes between the first impurity region and the second impurity region; a lower insulation layer that is formed on the active region, the device isolation layer, and the gate line; and first and second self-alignment contacts that pass through the lower insulation layer and are electrically connected to the first impurity region and the second impurity region, respectively. The first region and the second region are upper portions of the first and second self-alignment contacts, respectively.

The SNC may be used as a mask when the second insulation layer is patterned to expose the bit line contact.

The second insulation layer and the first insulation layer may be inclinedly etched so that an upper cross-section of the SNC is greater than a lower cross-section thereof (or etched such that sidewalls of the SNC are non-parallel) when the second insulation layer and the first insulation layer are patterned to expose the first region. The second insulation layer is inclinedly etched so that an upper cross-section of the bit line is greater than a lower cross-section thereof when the second insulation layer is patterned to expose the bit line contact.

The upper portion of the second conductive layer may be removed by using a chemical mechanical polishing (CMP) process.

The upper portion of the second conductive layer, and upper portions of the SNC and the second insulation layer, may be further removed by using the CMP process until (or such that) remaining parts of the SNC and second conductive layer are electrically separated from each other.

The method may further include forming a third insulation layer on the second insulation layer, the bit line, and the SNC. A landing plug may be formed on the SNC through the third insulation layer.

A method of manufacturing a semiconductor memory device, the method including forming a first insulation layer on a semiconductor substrate in which a first region and a second region are defined; forming a bit line contact on the second region through the first insulation layer; and forming a second insulation layer on the first insulation layer and the bit line contact. The second insulation layer and the first insulation layer are patterned until (or such that) the first region is exposed. A first conductive layer may be deposited on the first region and the second insulation layer. The first conductive layer and the second insulation layer are patterned until (or such that) the bit line contact is exposed. A second conductive layer is deposited on the bit line contact and the first conductive layer. A SNC and a bit line are formed by removing an upper portion of the second conductive layer and an upper portion of the first conductive layer until (such that) the second insulation layer is exposed. The SNC is electrically connected to the first region and is a remaining part of the first conductive layer. The bit line is electrically connected to the second region through the bit line contact and is a remaining part of the second conductive layer.

According to another example embodiment of the inventive concepts, there is provided a method of manufacturing a semiconductor memory device, the method including forming an insulation layer on a semiconductor substrate in which a first region and a second region are defined; and forming a SNC that passes through the insulation layer and is electrically connected to the first region. A conductive layer, which passes through the insulation layer and is electrically connected to the second region, is deposited on the insulation layer and the SNC. A bit line is formed by further removing an upper portion of the conductive layer, an upper portion of the insulation layer, and an upper portion of the SNC until (or such that) the SNC and the conductive layer are electrically separated from each other. The bit line is a remaining part of the conductive layer.

BRIEF DESCRIPTION OF THE DRAWINGS

Example embodiments of the inventive concepts will be more clearly understood from the following detailed description, taken in conjunction with the accompanying drawings in which.

DETAILED DESCRIPTION OF THE EMBODIMENTS

Figure 1A:
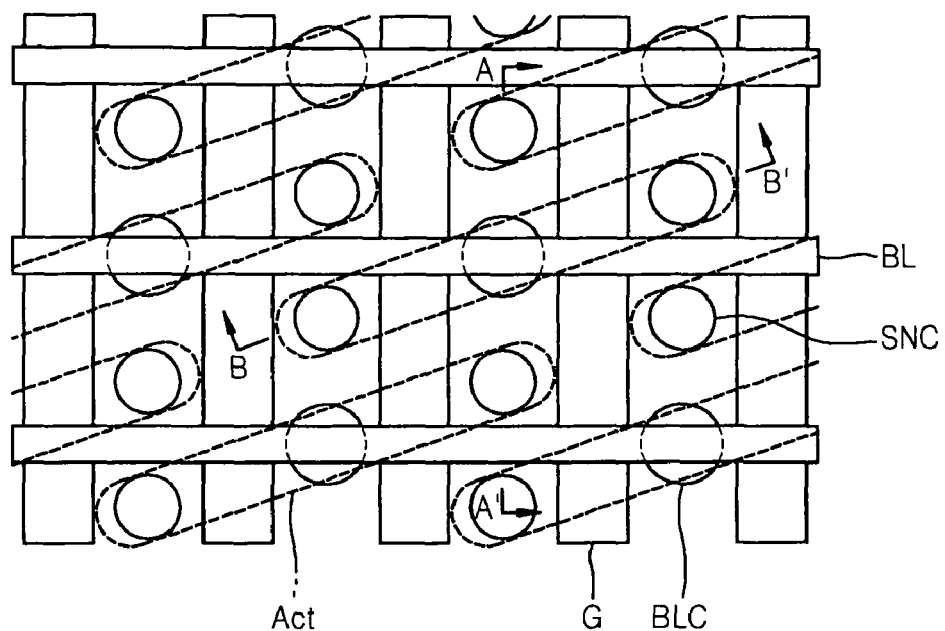
FIG. 1A is a plan view of a semiconductor memory device according to an example embodiment.

The attached drawings for illustrating example embodiments of the inventive concepts are referred to in order to gain a better understanding of the inventive concepts, the merits thereof, and the objectives accomplished by the implementation of the inventive concepts.

It will be understood that when a layer is referred to as being "on" another layer, it can be directly on the other layer, or intervening elements may also be present. In the drawings, lengths and sizes of layers and regions may be exaggerated for clarity. Like reference numerals in the drawings denote like elements. As used herein, the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

The inventive concepts relate to methods of manufacturing a semiconductor memory device, and more particularly, to methods of forming a bit line and a storage node contact (SNC) of a semiconductor memory device.

Figure 1B:
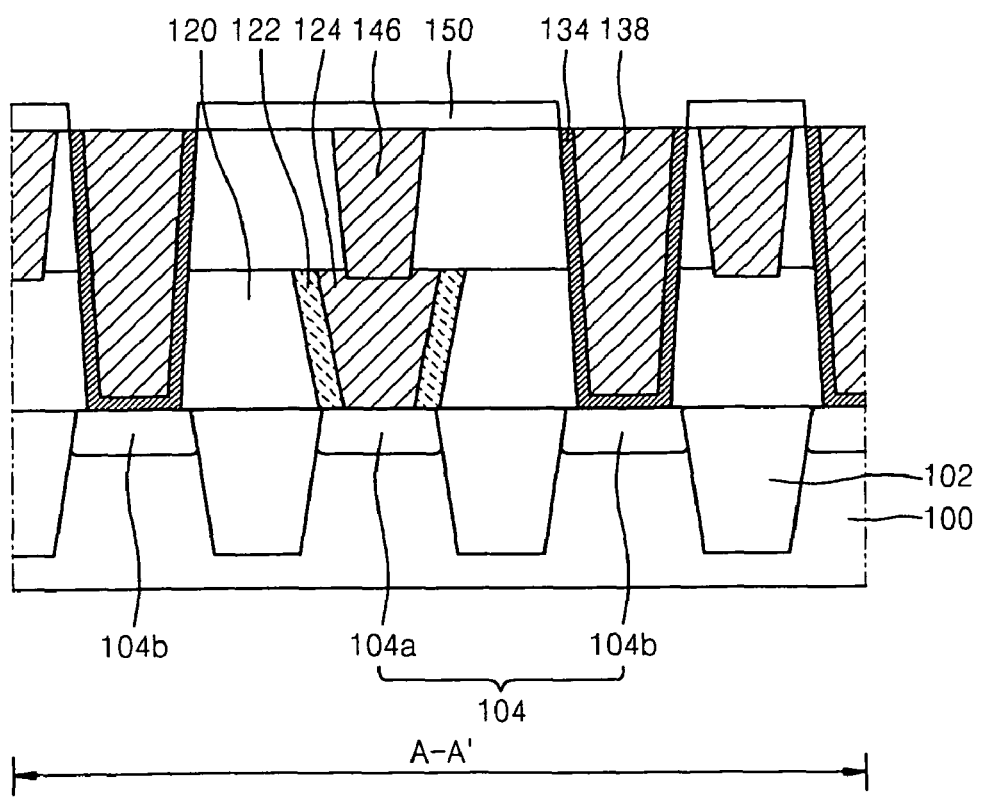
FIG. 1B is a cross-sectional view of the semiconductor memory device taken along line I-I' of FIG. 1A.

FIG. 1A is a plan view of a semiconductor memory device according to an example embodiment. FIG. 1B is a cross-sectional view of the semiconductor memory device taken along line I-I' of FIG. 1A.

Referring to FIGS. 1A and 1B, a plurality of device isolation layers 102 that define a plurality of active regions Act are disposed in a semiconductor layer 100. At least one impurity region 104 is disposed in each of the active regions Act. A plurality of gate lines G, each including a gate insulation layer and a gate electrode layer, are disposed in the active regions Act and the device isolation layers 102. In the present embodiment, three impurity regions 104, including one drain region 104a and two source regions 104b, and two gates lines G are disposed in one active region Act. However, the number of the impurity regions 104 and the number of the gate lines G that are disposed in each active region Act may be different.

A first insulation layer 120 and a second insulation layer 130 are disposed in the device isolation layers 102 and the active regions Act in which the impurity regions 104 are disposed. A bit line contact 124 is electrically connected to the drain region 104a through the first insulation layer 120. Spacers 122 may be disposed on the sidewall of the bit line contact 124. At least one bit line 146, which is electrically connected to the upper portion of the bit line contact 124, is disposed on the bit line contact 124 and a part of the first insulation layer 120. At least one storage node contact (SNC) 138 is electrically connected to each of the source regions 104b through the first insulation layer 120 and the second insulation layer 130. A barrier metal layer 134 may be disposed on the sidewalls and the bottom of the SNCs 138. A third insulation layer 150 through which the SNCs 138 are exposed may be disposed on the second insulation layer 130 and the bit lines 146. A landing plug (not shown) may be disposed on the SNCs 138. A capacitor (not shown) including a storage electrode may be disposed on the landing plug.

Referring to FIG. 1A, the active regions Act may be inclined at a set angle and cross a plurality of bit lines BL. The bit lines BL extending in a direction (for example, along the y-axis) may cross a plurality of bit line contacts BLC formed in the drain region 104a of the active regions Act. The gate lines G may cross the bit lines BL at a substantially perpendicular (or 90°) angle. The gate lines G may be disposed between the drain region 104a and the source regions 104b of the active regions Act. Two SNCs may be disposed on the source regions 104b of the active regions Act that are disposed on both sides of the bit line contacts BLC. The SNCs may not cross (or overlap with) the gate lines G and the bit lines BL. The inventive concepts are not limited to the layouts shown in FIGS. 1A and 1B, and the layouts are for providing an easy understanding of the inventive concepts. The bit lines BL, the bit line contacts BLC and the SNCs shown in FIG. 1A correspond to the bit lines 146, the bit line contacts 124 and the SNCs 138 shown in FIG. 1B, respectively.

Figure 1C:
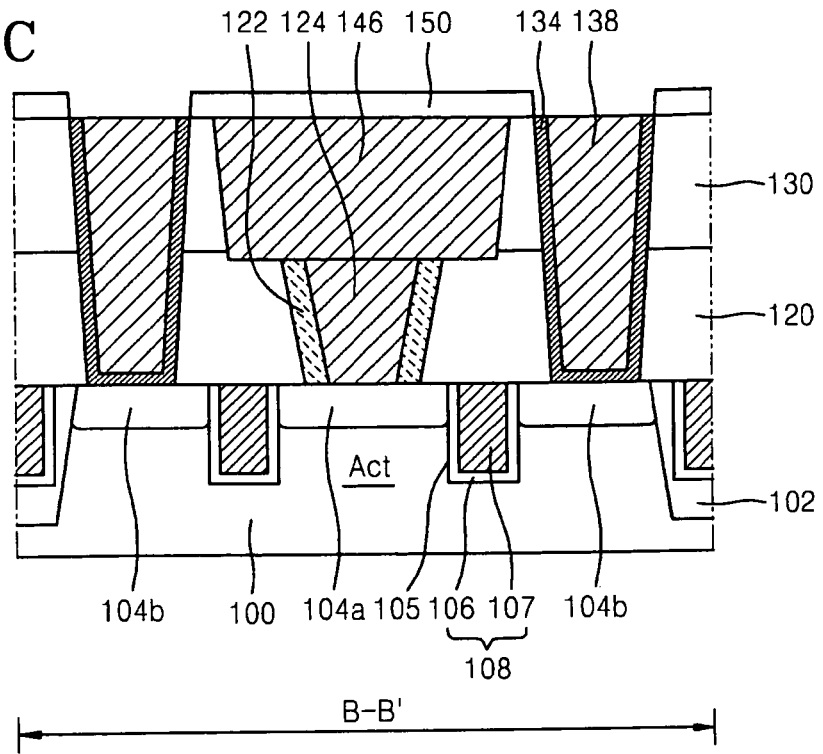
FIG. 1C is a cross-sectional view of a plurality of gate lines of the semiconductor memory device taken along line II-II' of FIG. 1A.
Figure 1D:
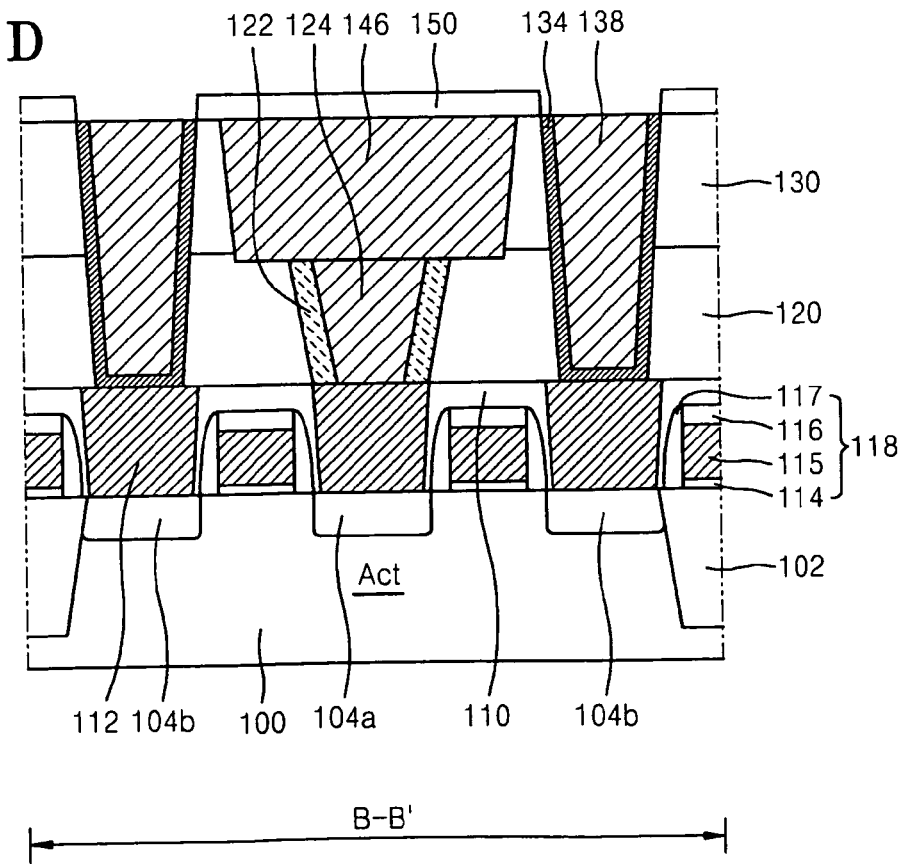
FIG. 1D is a cross-sectional view of a plurality of gate lines of the semiconductor memory device according to yet another example embodiment.

FIG. 1C is a cross-sectional view of a plurality of gate lines of the semiconductor memory device taken along line II-IF of FIG. 1A according to an example embodiment. FIG. 1D is a cross-sectional view of a plurality of gate lines of the semiconductor memory device according to yet another example embodiment. An upper portion of the first insulation layer 120 shown in FIGS. 1C and 1D is substantially identical to an upper portion of the first insulation layer 120 shown in FIG. 1B and thus the description thereof will not be repeated here for the sake of brevity. A lower portion of the first insulation layer 120 shown in FIGS. 1C and 1D will now be described. In the present specification, the lower portion of the first insulation layer 120 is referred to as a semiconductor substrate. The gate lines G shown in FIG. 1A correspond to gate lines 108 and 118 shown in FIGS. 1C and 1D, respectively.

Referring to FIG. 1C, the gate line 108 may be recessed into the semiconductor layer 100 between the drain region 104a and the source regions 104b. The gate lines 108 each include a gate insulation layer 106 and a gate electrode layer 107. The semiconductor substrate including the gate lines 108 may be manufactured, for example, by performing the following process.

The device isolation layer 102 that defines the active regions Act of the semiconductor layer 100 is formed. The semiconductor layer 100 may include, for example, a semiconductor substrate (e.g., a silicon substrate or silicon-germanium substrate), an epitaxial layer, a silicon-on-insulator (SOI) layer, a semiconductor-on-insulator (SeOI) layer and the like. The device isolation layer 102 may be a shallow trench isolation (STI) region in order to increase speed and integration of a device. The device isolation layer 102 may include, for example, at least one of a silicon oxide, a silicon nitride, a silicon oxide-nitride and combinations thereof.

A trench 105 is formed in the active regions Act defined by the device isolation layer 102 in order to form a recess channel. A plurality of trenches 105 may be formed in the active regions Act. For example, an anisotropic etching (e.g., reactive ion etching (RIE) or plasma etching), or inclination etching may be used to form the trenches 105.

The gate insulation layer 106 is formed on the sidewall and the bottom of the trench 105. The gate insulation layer 106 may be, for example, a composite layer with a double layer structure including a silicon oxide layer and a silicon nitride layer, or a silicon oxide layer having a nitrated surface. The gate insulation layer 106 may be formed using various methods of, for example, thermal oxidation, rapid thermal oxidation (RTO), chemical vapor deposition (CVD), plasma enhanced CVD (PECVD), high density plasma CVD (HDP-CVD), digital CVD, pulsed CVD, atomic layer deposition (ALD) or sputtering.

The gate electrode layer 107 is formed on the surface of the gate insulation layer 106. The gate electrode layer 107 may be formed using CVD, PECVD, HDP-CVD, sputtering, metal organic CVD (MOCVD) or ALD. The gate electrode layer 107 may include at least one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr) or combinations thereof. The gate electrode layer 107 may further include nitride, silicide or combinations thereof. The silicide may include cobalt silicide $CoSi_x$, nickel silicide $NiSi_x$, titanium silicide $TiSi_x$, tungsten silicide $WSi_x$, tantalum silicide $TaSi_x$ or combinations thereof.

Alternatively, the gate insulation layer 106 and the gate electrode layer 107 may be recessed into the trench 105 using partial etching. Thereafter, a capping layer (not shown) may be formed on the gate insulation layer 106 and the gate electrode 107 in the recessed trench 105. The capping layer may be formed, for example, using CVD. The capping layer is filled in the recessed trench 105 and may protrude from a surface of the semiconductor layer 100. The capping layer may include, for example, silicon oxide or silicon nitride.

The drain region 104a and the source region 104b may be formed by ion injecting n-type impurities or p-type impurities into regions that are exposed by using a photo-etching process.

Referring to FIG. 1D, the gate line 118 may protrude from the semiconductor layer 100 between the drain region 104a and the source regions 104b. The gate line 118 includes a gate insulation layer 114 and a gate electrode layer 115. The gate line 118 may further include, for example, a capping layer 116 and a spacer 117. A semiconductor substrate including the gate line 118 may be manufactured, for example, by performing the following process. The description with reference to FIG. 1D that is the same as described with reference to FIG. 1C will be omitted or mentioned only briefly for the sake of brevity.

For example, a lower silicon oxide layer is formed using thermal oxidation on the semiconductor layer 100 in which the device isolation layer 102 is formed. For example, a polysilicon layer containing conductive impurities is formed on the front surface of the semiconductor layer 100 in which the lower silicon oxide layer is formed. For example, an upper silicon oxide layer is formed on the front surface of the semiconductor layer 100 on which the polysilicon layer is formed. The gate insulation layer 114, the gate electrode layer 115 and the capping layer 116 are formed by patterning the lower silicon oxide layer, polysilicon layer and the upper silicon oxide layer by using photolithography and etching processes. Thereafter, the spacer 117 is formed on the sidewalls of the gate insulation layer 114, the gate electrode layer 115 and the capping layer 116 by forming a silicon nitride layer of a set thickness on the front surface of the semiconductor layer 100 and removing the silicon nitride layer by using a dry etching method having anisotropic etching characteristics so that the drain and source regions 104a and 104b are exposed. The drain region 104a and the source region 104b are formed by ion-injecting n-type impurities or p-type impurities into regions in which the impurity regions 104 will be formed by using a self-aligning method of using the gate line 118, in particular, the spacer 117, as an ion injection mask. Thereafter, for example, a lower insulation layer 110 formed of silicon oxide is formed on the front surface of the semiconductor layer 100 by using, for example, CVD. An opening, by which the drain and source regions 104a and 104b are exposed, is formed by patterning the lower insulation layer 110 by performing a self-aligning method using the gate line 118 as a mask. A plurality of self-alignment contacts 112 that are electrically connected to the drain and source regions 104a and 104b are formed by filling the opening using, for example, a conductive material (e.g., polysilicon).

The descriptions with reference to FIGS. 1C and 1D are examples, and thus the inventive concepts are not limited to the example embodiments provided in FIGS. 1C and 1D.

Figure 2:
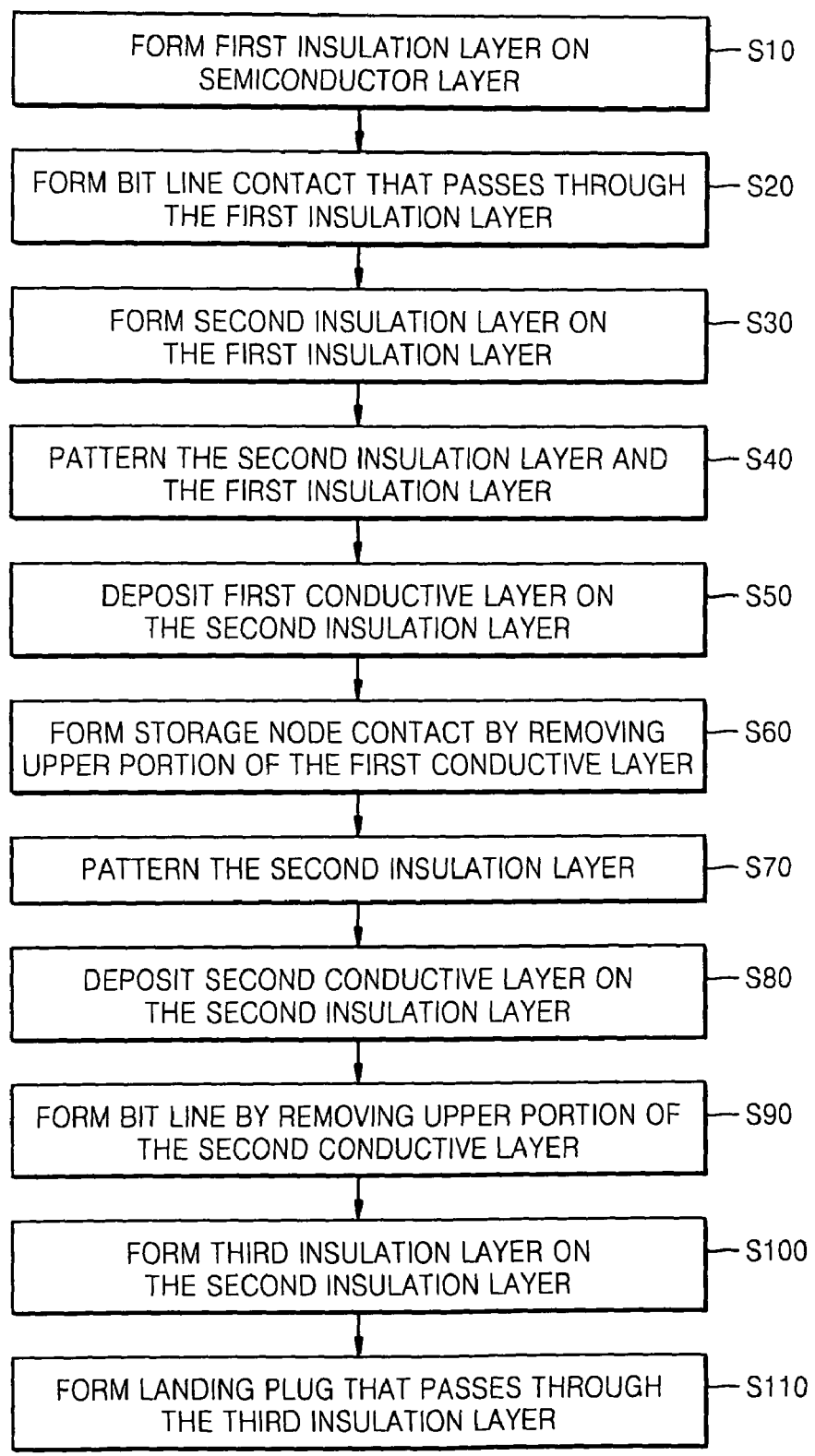
FIG. 2 is a flowchart illustrating a method of manufacturing the semiconductor memory device of FIGS. 1A through 1C according to a further example embodiment.

FIG. 2 is a flowchart illustrating a method of manufacturing the semiconductor memory device of FIGS. 1A through 1C according to a further example embodiment. However, the present embodiment of the inventive concepts can be applied to the semiconductor memory device shown in FIG. 1D as well.

FIGS. 3A through 3I are cross-sectional views of the semiconductor memory device taken along line I-I' of FIG. 1A with reference to the method of manufacturing the semiconductor memory device of FIG. 2.

Figure 3A:
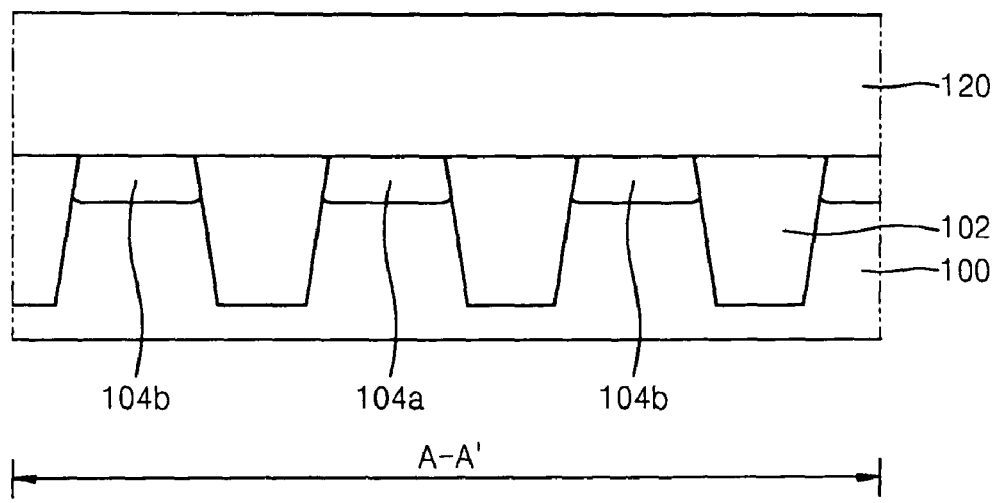
FIGS. 3A through 3I are cross-sectional views of the semiconductor memory device taken along line I-I' of FIG. 1A with reference to the method of manufacturing the semiconductor memory device of FIG. 2.

Referring to FIGS. 2 and 3A, the first insulation layer 120 is formed on a semiconductor substrate (operation S10). The semiconductor substrate is referred to as a structure before the first insulation layer 120 is formed. The semiconductor substrate includes the semiconductor layer 100, the device isolation layer 102, and the drain and source regions 104a and 104b. The semiconductor substrate may further include the gate line 108 recessed into the semiconductor layer 100 as shown in FIG. 1C. The semiconductor substrate may further include the gate line 118, the self-alignment contacts 112 and the lower insulation layer 110 that protrude from the semiconductor layer 100 as shown in FIG. 1D. The first insulation layer 120 may be formed of silicon oxide deposited by using, for example, CVD.

Figure 3B:
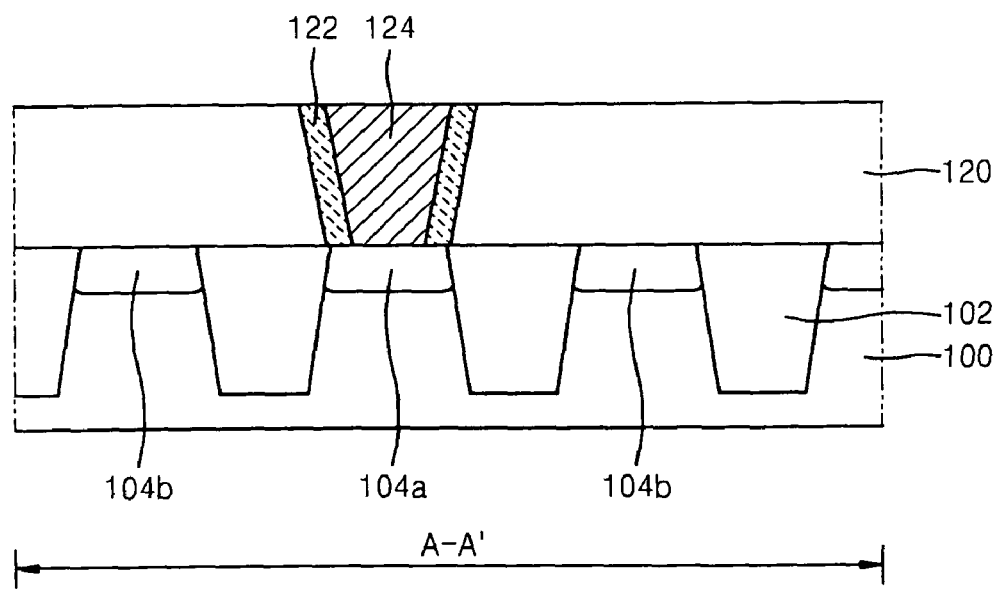

Referring to FIGS. 2 and 3B, the bit line contact 124 that passes through the first insulation layer 120 is formed on the semiconductor substrate (operation S20). The spacers 122 may be formed on both sidewalls of the bit line contact 124. The bit line contact 124 is electrically connected to the drain region 104a of the semiconductor substrate. A process of forming the bit line contact 124 is described as follows. An opening by which the drain region 104a is exposed may be formed by using photolithography and etching processes. The side surface and bottom of the opening may be covered by depositing, for example, a silicon nitride layer (not shown) of a set thickness on the drain region 104a exposed by the opening and the first insulation layer 120. Thereafter, the spacer 117 may be formed by removing the silicon nitride layer by using a dry etching method having anisotropic etching characteristics so that the drain region 104a is exposed. Thereafter, the opening in which the spacers 117 are formed may be buried by depositing a conductive material (not shown) on the first insulation layer 120. Thereafter, the bit line contact 124 may be formed by removing an upper portion of the conductive material so that the first insulation material 120 is exposed. The upper portion of the conductive material may be removed by using, for example, a CMP or etching-back process. The bit line contact 124 may include at least one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr) or combinations thereof. The bit line contact 124 may further include nitride, silicide or combinations thereof. The silicide may include cobalt silicide $CoSi_x$, nickel silicide $NiSi_x$, titanium silicide $TiSi_x$, tungsten silicide $WSi_x$, tantalum silicide $TaSi_x$ or combinations thereof.

Figure 3C:
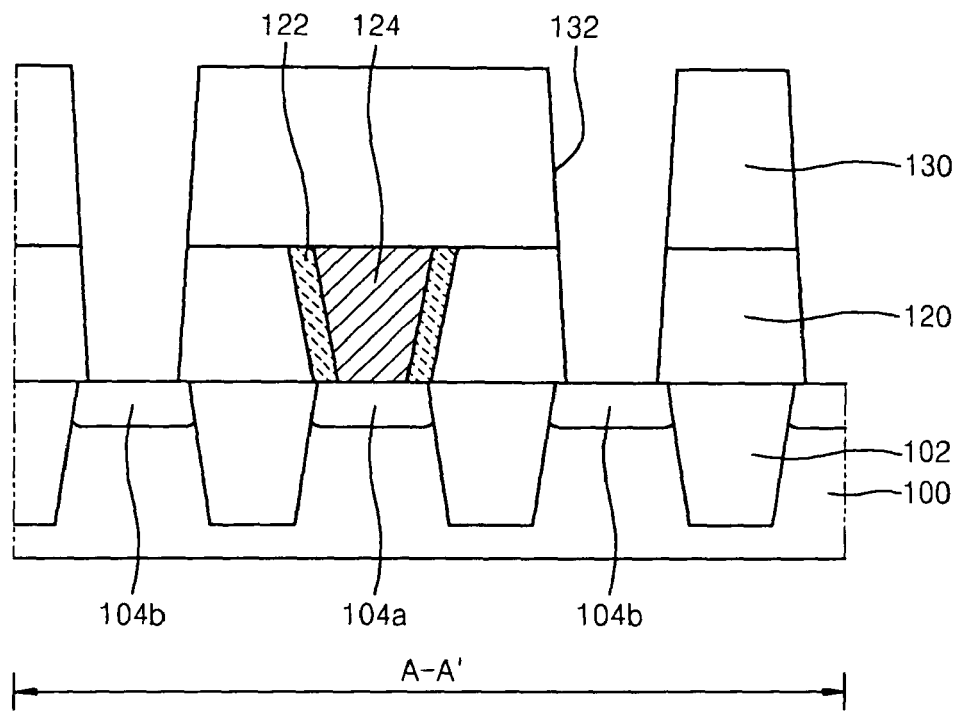

Referring to FIGS. 2 and 3C, the second insulation layer 130 is formed on the first insulation layer 120 and the bit line contact 124 (operation S30). The second insulation layer 130 may be a silicon oxide layer deposited by using, for example, CVD. An opening 132, by which the source regions 104b are exposed, is formed by patterning the second insulation layer 130 and the first insulation layer 120 (operation S40). The opening 132 may be formed by using photolithography and etching processes. A cleaning process may be performed to remove etching remnants of the etching process. A cleaner (e.g., HF), a buffer oxide etchant (BOE) and the like may be used to perform the cleaning process. An upper portion of the opening 132 may be greater than the lower portion thereof as a result of the cleaning process as shown in FIG. 3C. That is, the sidewall of the opening 132 may be inclined so that the upper cross section of the opening 132 is greater than the lower cross section thereof. The time taken to perform the cleaning process and an amount of the cleaner used to perform the cleaning process may be adjusted to control the inclination of the sidewall of the opening 132. Alternatively, the upper portion of the opening 132 may be enlarged by further performing an isotropic etching process after performing an etching process for forming the opening 132.

Figure 3D:
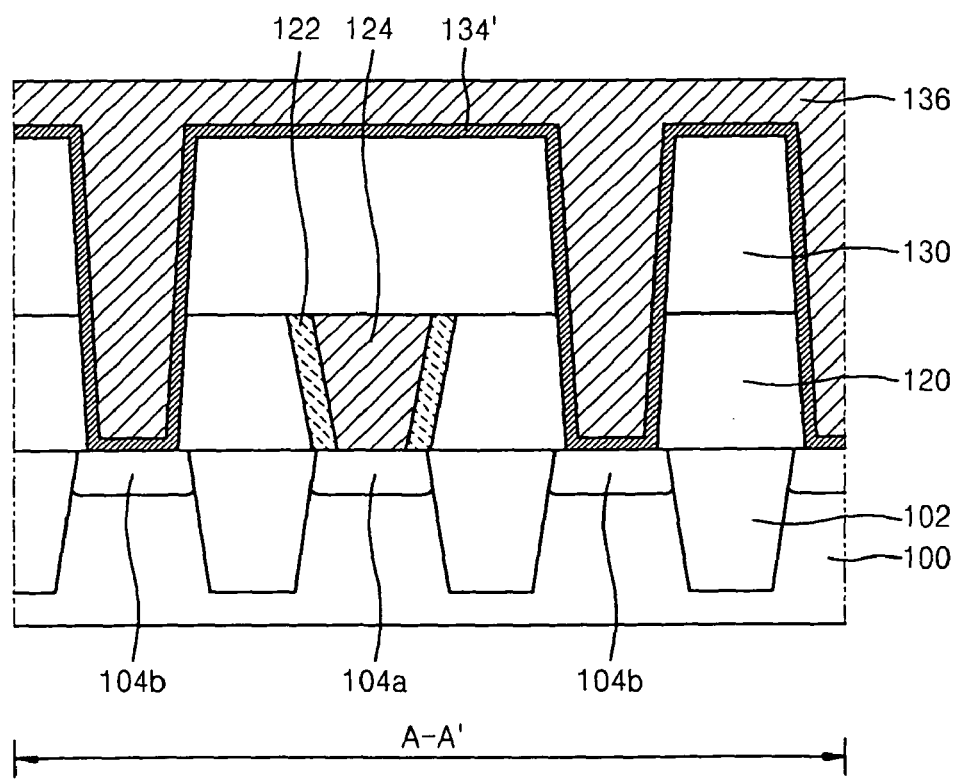

Referring to FIGS. 2 and 3D, a first conductive layer 136 is deposited on the second insulation layer 130 in which the opening 132 is formed and the exposed portions of the source regions 104b (operation S50). The first conductive layer 136 may be deposited using CVD. Before the first conductive layer 136 is deposited, a barrier metal material 134' may be formed on the second insulation layer 130 and the source region 104b as shown in FIG. 3D. The first conductive layer 136 may be formed of the same material as the bit line contact 124. The first conductive layer 136 may be formed of, for example, tungsten (W).

Figure 3E:
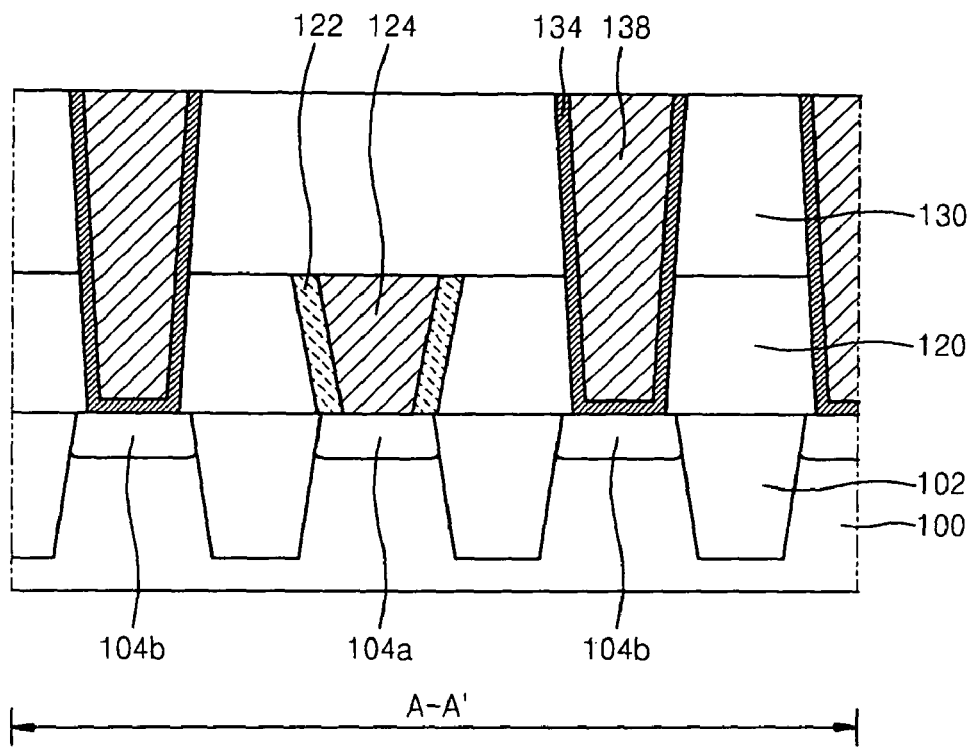

Referring to FIGS. 2 and 3E, a SNC 138 is formed by removing an upper portion of the first conductive layer 136 until the second insulation layer 130 is exposed (operation S60). The upper portion of the first conductive layer 136 may be removed by using, for example, a CMP or etching-back process. Barrier metal layers 134 may be formed on the side surface and the bottom of the SNC 138 as shown in FIG. 3E. The barrier metal layers 134 may contain, for example, Ti/TiN. The barrier metal layer 134 may prevent the conductive material of the SNC 138 from spreading to the source regions 104b and the first and second insulation layers 120 and 130.

Figure 3F:
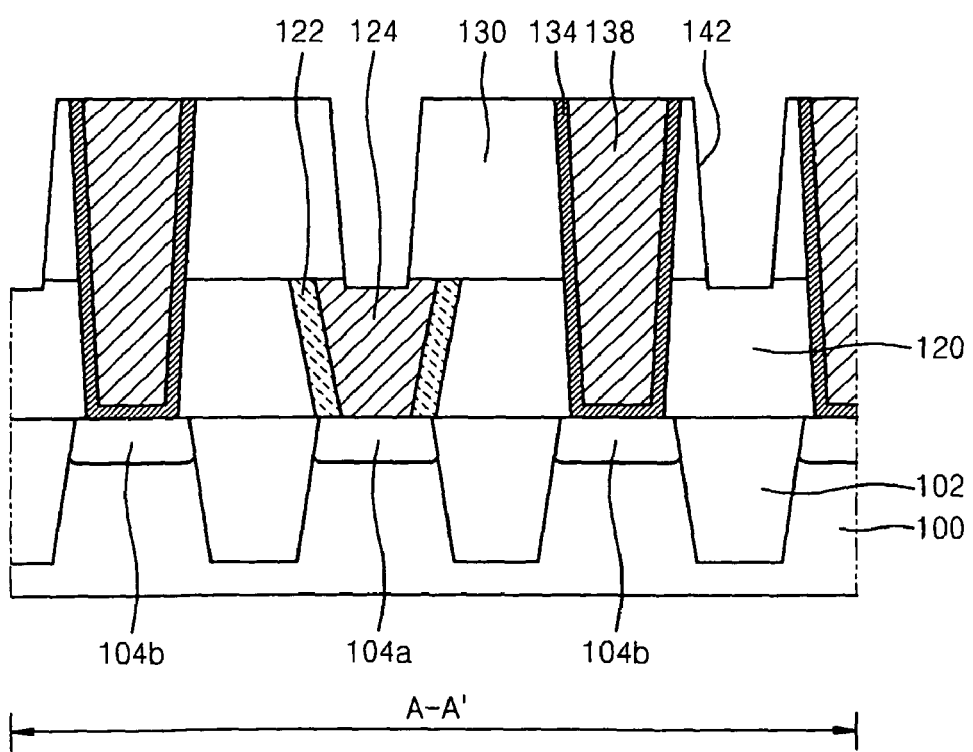

Referring to FIGS. 2 and 3F, an opening 142, by which the bit line contact 124 is exposed, is formed by patterning the second insulation layer 130. The opening 142 is used to form a bit line during a subsequent process in such a way the side surface of the SNC 138 is not exposed. The opening 142 may be formed using photolithography and etching processes. In this regard, the SNC 138 having a different etching ratio from the second insulation layer 130 may be used as an etching mask during an etching process for forming the opening 142. Thereafter, a cleaning process may be performed to remove etching remnants of the etching process. As a result, the sidewall of the opening 142 may be inclined so that the upper width of the opening 142 is greater than the lower width thereof as shown in FIG. 3F. Thus, only the uppermost portion of the sidewall of the SNC 138 is exposed through the opening 142. This will be described in more detail with reference to FIGS. 4A through 4C. A part of the first insulation layer 120 as well may be exposed through the opening 142 as shown in the locations where the bit lines BL of FIG. 1A are formed.

Figure 3G:
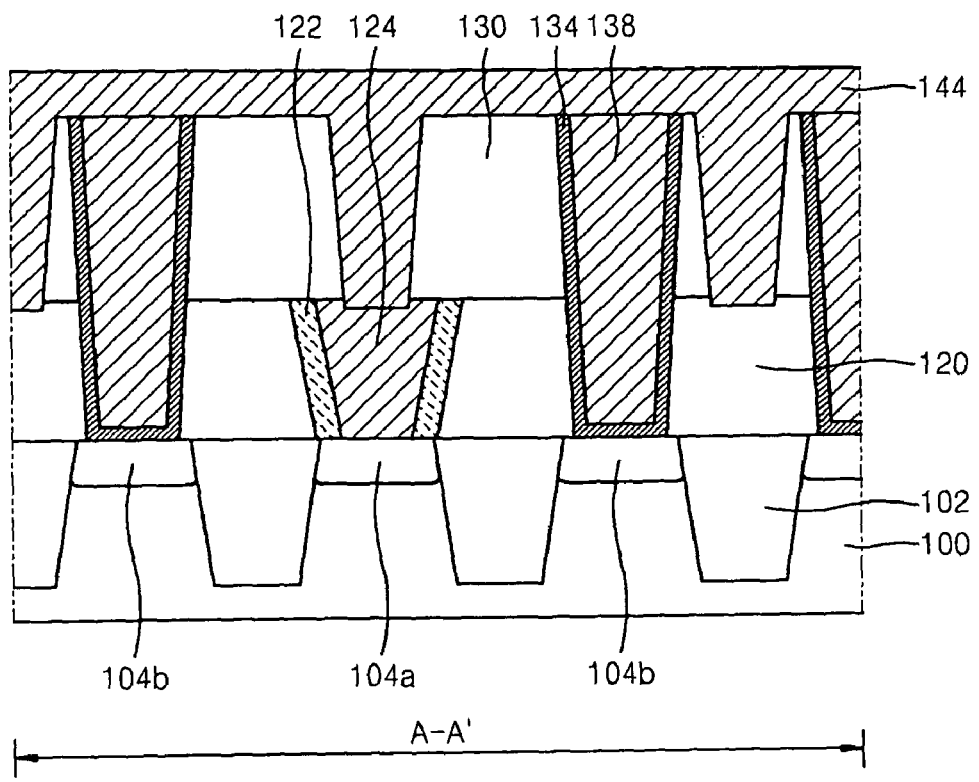

Referring to FIGS. 2 and 3G, a second conductive layer 144 is deposited on the second insulation layer 130 in which the opening 142 is formed and the bit line contact 124 exposed through the opening 142 (operation S80). The opening 142 formed in the second insulation layer 130 is buried by the second conductive layer 144. The second conductive layer 144 may be formed of the same material as the bit line contact 124 and/or the SNC 138. For example, the second conductive layer 144 may be formed of, for example, tungsten (W). The second conductive layer 144 also may be deposited by using, for example, CVD. The second conductive layer 144 is electrically connected to the bit line contact 124 and accordingly is electrically connected to the drain region 104a.

Figure 3H:
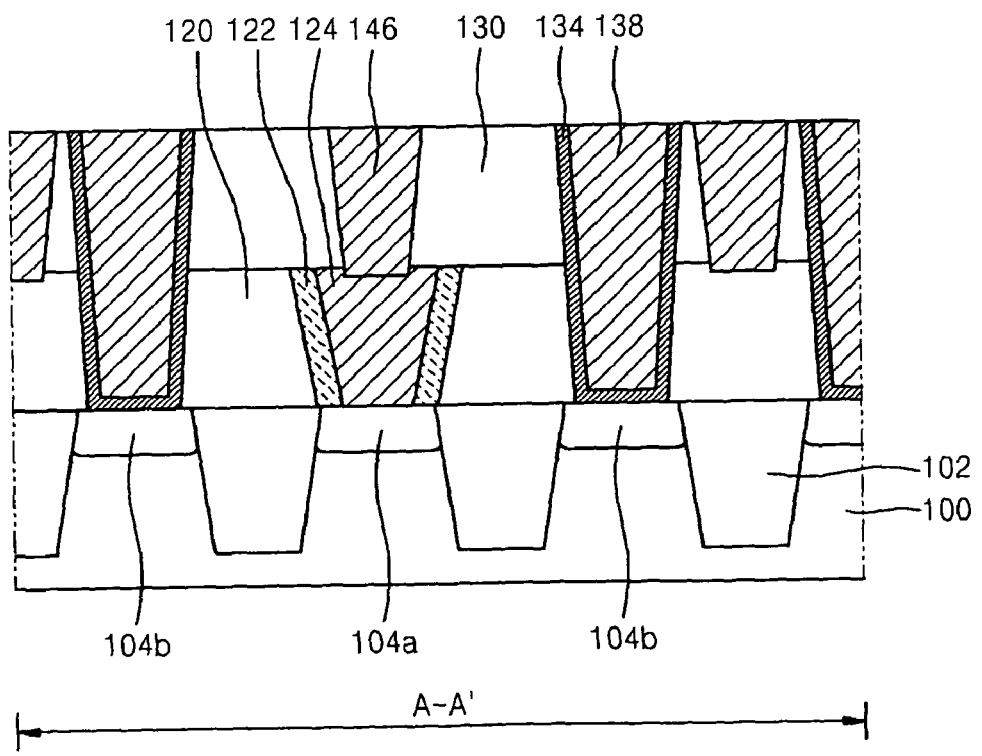

Referring to FIGS. 2 and 3H, a bit line 146 is formed by removing an upper portion of the second conductive layer 144 until the second insulation layer 130 is exposed (operation S90). Because the upper portion of the sidewall of the SNC 138 may be electrically connected to the second conductive layer 144, the SNC 138 and a remaining part of the second conductive layer 144 (i.e., the bit line 146) may be electrically separated from each other by further removing the upper portion of the second insulation layer 130 and the upper portion of the SNC 138. The upper portions of the second conductive layer 144, the second insulation layer 130, and the SNC 138 may be removed by using CMP, wherein the CMP process can reduce the entire height of the semiconductor memory device.

Figure 3I:
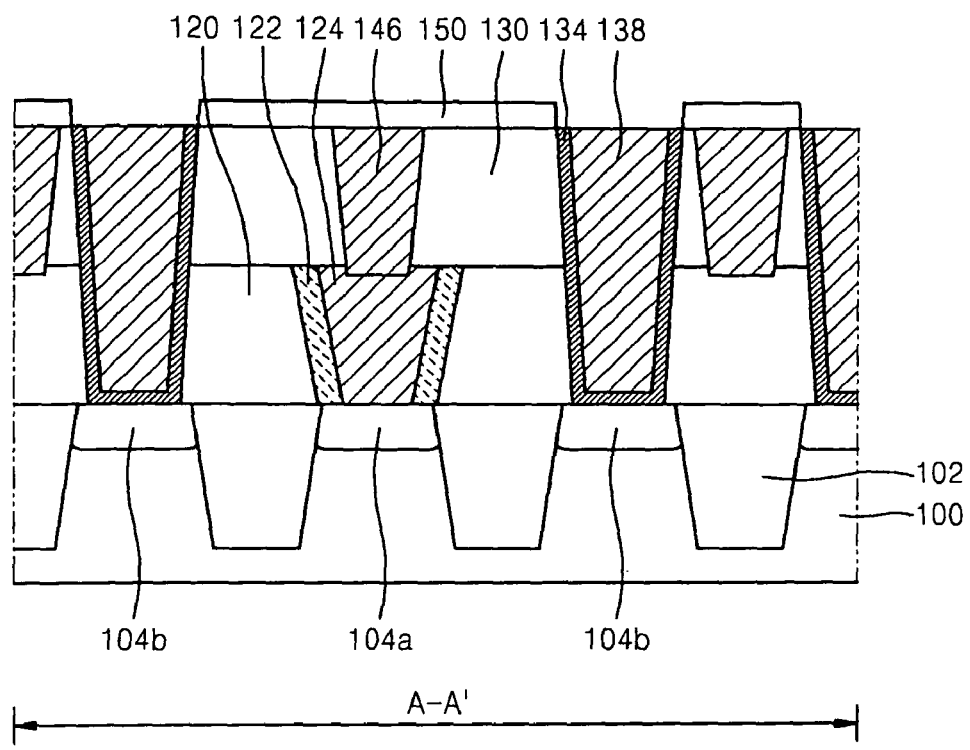

Referring to FIGS. 2 and 3I, a third insulation layer 150 is formed on the second insulation layer 130 (operation S100). An opening by which the SNC 138 is exposed may be formed by patterning the third insulation layer 150 using photolithography and etching processes. Thereafter, a landing plug (not shown) that is electrically connected to the SNC 138 is formed by burying the opening of the third insulation layer 150 with a conductive material and flattening the buried opening (operation S110). A storage, for example, a capacitor (not shown), may be formed on the landing plug. The capacitor is a capacitor over bit line (COB), which is electrically connected to the source regions 104b of the semiconductor substrate through the SNC 138. The bit line 146 is electrically connected to the drain region 104 through the bit line contact 124.

Referring to FIG. 3I, the second insulation layer 130 formed of, for example, silicon oxide, is only disposed between the bit line 146 and the SNC 138. If a spacer formed of, for example, silicon nitride, is disposed between the bit line 146 and the SNC 138, an undesired large parasitic capacitance may be generated between the bit line 146 and the SNC 138 due to the silicon nitride having a dielectric constant substantially higher than that of the silicon oxide. However, according to the present embodiment of the inventive concepts, an electrical insulation between the bit line 146 and the SNC 138 can be achieved without the spacer and thus a relatively small parasitic capacitance is generated between the bit line 146 and the SNC 138, thereby reducing a bit line loading capacitance.

The descriptions with reference to FIGS. 2 and 3A through 3I are examples, and thus the inventive concepts are not limited to the example embodiments provided in FIGS. 2 and 3A through 3I.

Figure 4A:
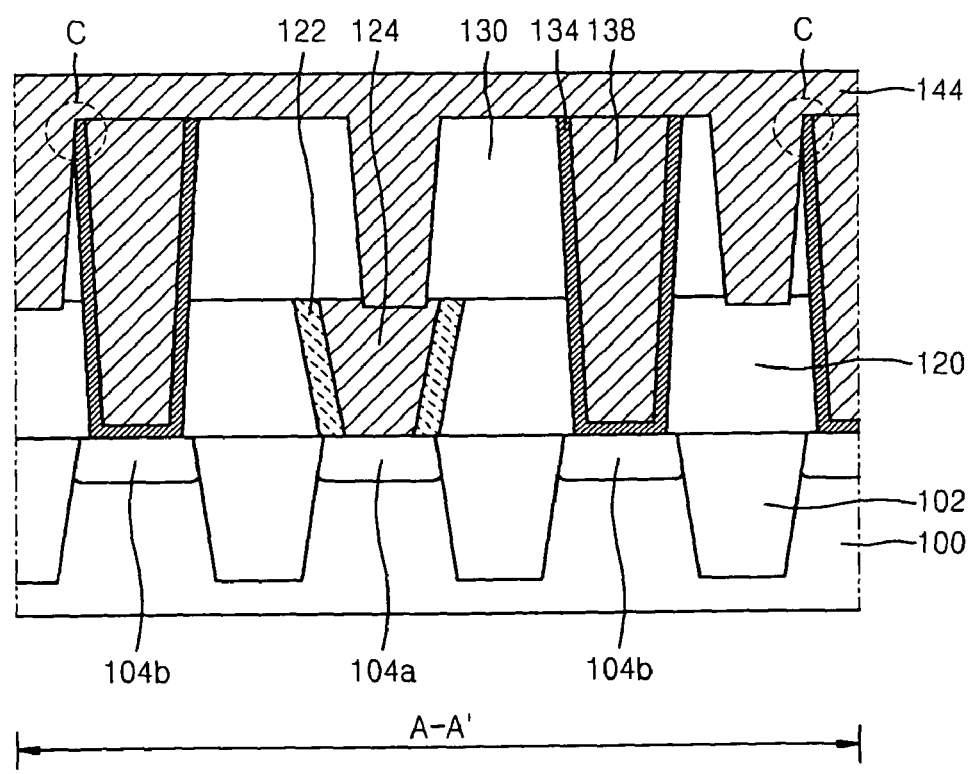
FIGS. 4A through 4C are cross-sectional views of the semiconductor memory device taken along line I-I' of FIG. 1A for explaining a subsequent process when a misalignment occurs.
Figure 4B:
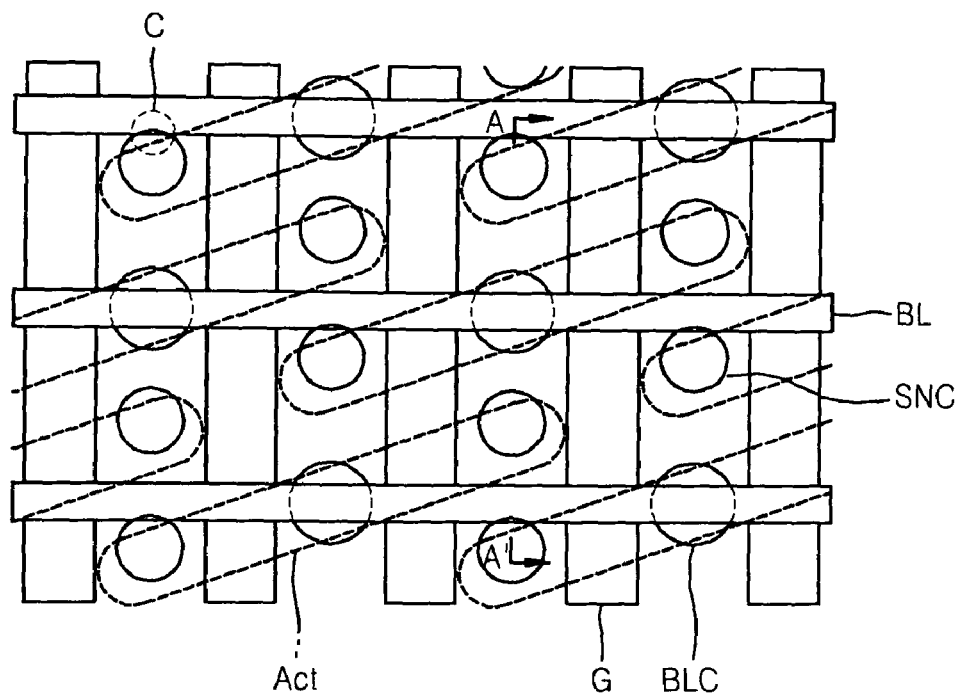
Figure 4C:
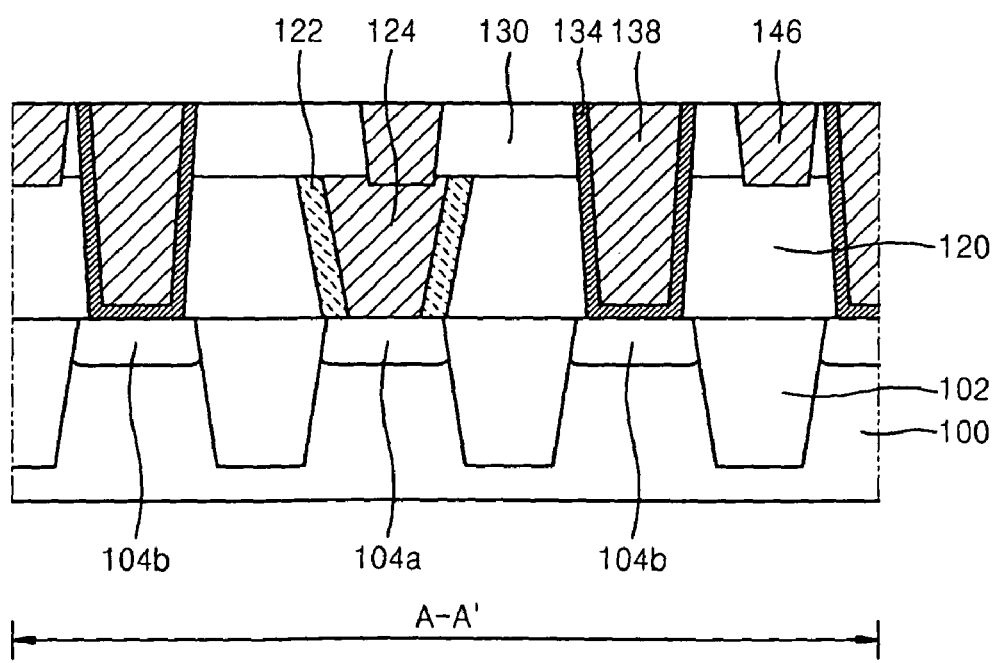

FIGS. 4A through 4C are cross-sectional views of the semiconductor memory device taken along line I-I' of FIG. 1A for explaining a subsequent process when a misalignment occurs. That is, the side surface of the SNC 138 is exposed through the opening 142 of FIG. 3F due to the misalignment.

Referring to FIG. 4A, the second conductive layer 144 is electrically connected to the side surface of the SNC 138 as indicated with C. As described above, during an etching process for forming the opening 142 so as to form the second conductive layer 144, when the SNC 138 is used as an etching mask and is etched so that the sidewalls of the opening 142 and the opening 132 are inclined, the second conductive layer 144 and the upper portion of the sidewall of the SNC 138 are electrically connected to each other.

Referring to FIG. 4B which is a plan view of the cross-sectional view of the FIG. 4A, the SNC 138 is short-circuited from the bit line BL as indicated with C.

Referring to FIG. 4C, the SNC 138 and a remaining part of the second conductive layer 144 (i.e., the bit line 146) may be electrically separated from each other by removing the upper portion of the second insulation layer 130, and if necessary removing the upper portion of the SNC 138 and the upper portion of the second conductive layer 144 as well. Thus, in spite of the misalignment, a reliable electrical insulation between the bit line 146 and the SNC 138 can be achieved. Also, the bridge characteristics between the bit line 146 and the SNC 138 increase without a bit line spacer.

Figure 5:
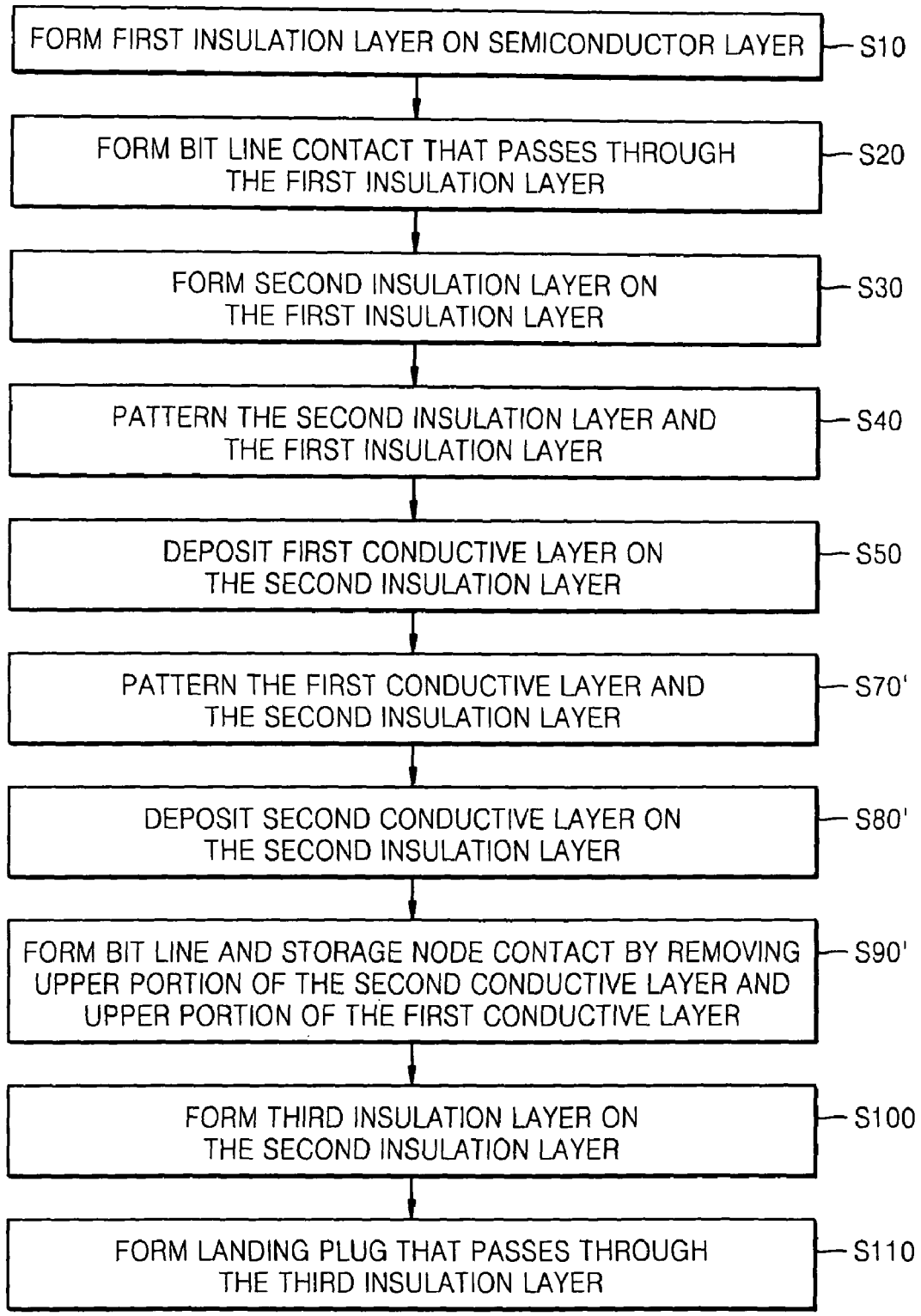
FIG. 5 is a flowchart illustrating a method of manufacturing the semiconductor memory device of FIGS. 1A through 1C according to another example embodiment.
Figure 6A:
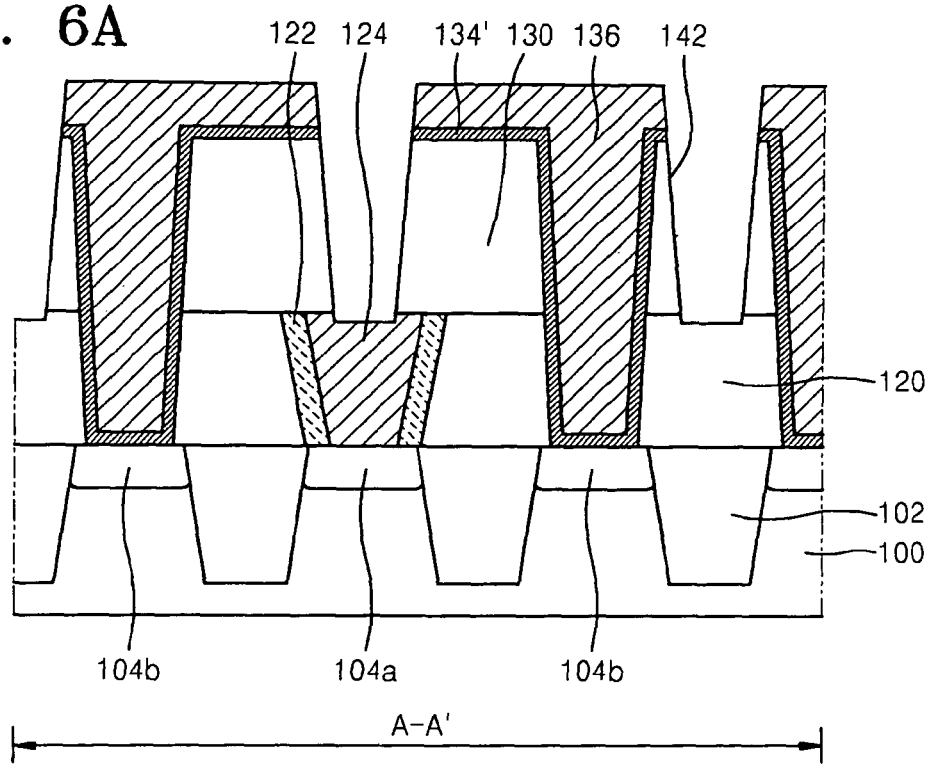
FIGS. 6A through 6C are cross-sectional views of the semiconductor memory device taken along line I-I' of FIG. 1A with reference to operations S70' through S90' of FIG. 5.
Figure 6B:
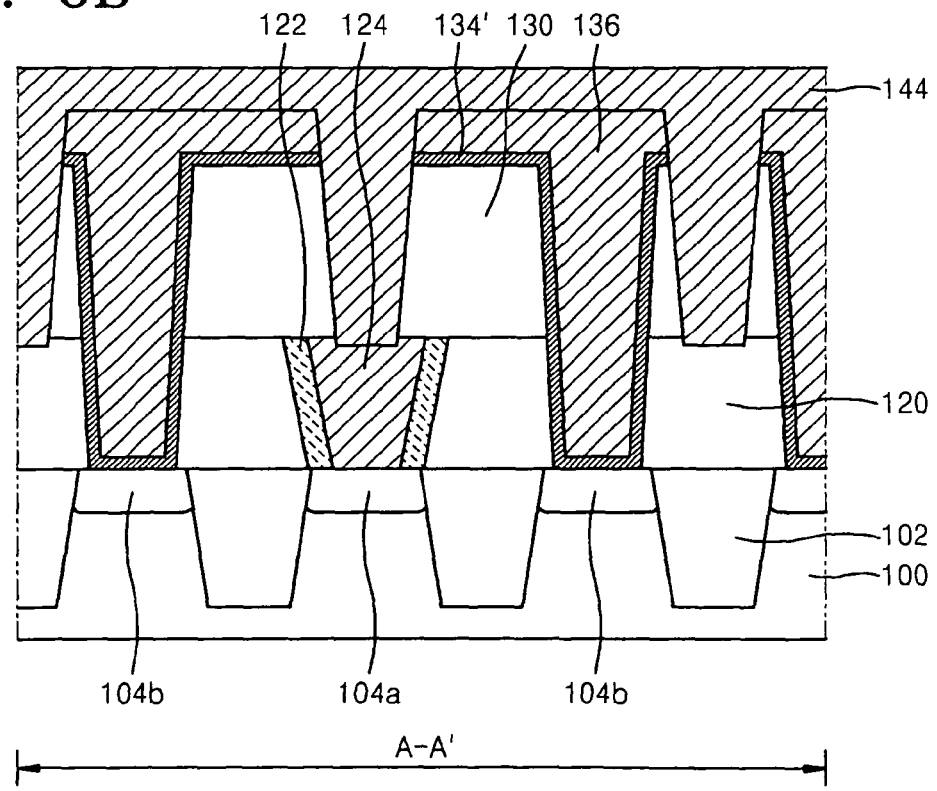
Figure 6C:
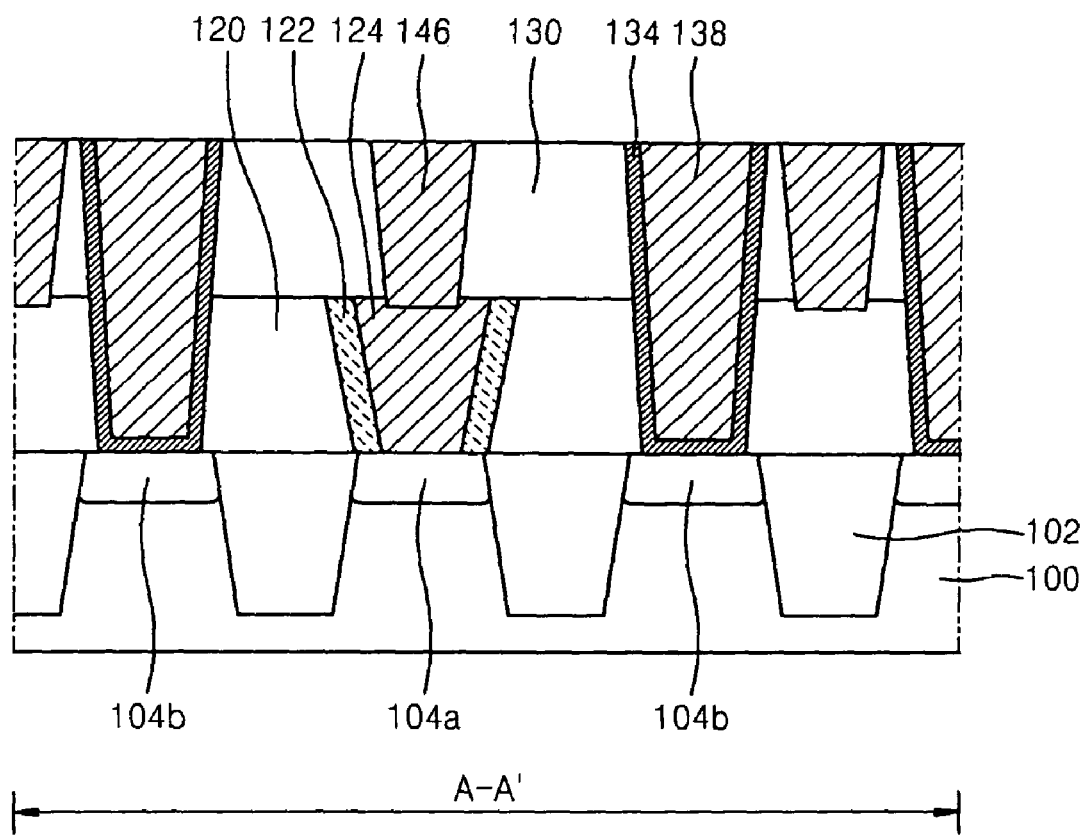

FIG. 5 is a flowchart illustrating a method of manufacturing the semiconductor memory device of FIGS. 1A through 1C according to another example embodiment. FIGS. 6A through 6C are cross-sectional views of the semiconductor memory device taken along line I-I' of FIG. 1A for explaining operations S70' through S90' of FIG. 5.

The operations S10-S50 shown in shown in FIG. 5 are the same as operations S10-S50 shown in FIG. 2. Thus, a description of the same operations and elements between FIGS. 2 and 5 will not be repeated here for the sake of brevity.

Referring to FIG. 3D, the first conductive layer 136 is deposited on the second insulation layer 130 and the source regions 104b exposed through the opening 132 (operation S50). The first conductive layer 136 is electrically connected to the source regions 104b by being buried in the opening 132. The barrier metal layer 134' may be deposited before the first conductive layer 136 is deposited. The barrier metal layer 134' is described in further detail above.

Thereafter, referring to FIGS. 5 and 6A, the opening 142 by which the bit line contact 124 is exposed is formed by patterning the first conductive layer 136 and the second insulation layer 130 (operations S70'). The opening 142 may be formed using photolithography and etching processes. The opening 142 of FIG. 6A may also be formed to have an inclined sidewall as shown in FIG. 3F.

Referring to FIGS. 5 and 6B, the second conductive layer 144 is formed on the first conductive layer 136 and the portion of the bit line contact 124 exposed through the opening 142 (operations S80'). The second conductive layer 144 is electrically connected to the bit line contact 124 by being buried in the opening 142.

Referring to FIGS. 5 and 6C, the bit line 146 and the SNC 138 are simultaneously formed by removing the upper portion of the second conductive layer 144 and the upper portion of the first conductive layer 136 until the second insulation layer 144 is exposed (operation S90'). The upper portion of the second conductive layer 144 and the upper portion of the first conductive layer 136 may be removed by using a CVD process. Also, in order to secure the electrical separation between the bit line 146 and the SNC 138, the upper portion of the second insulation layer 130, the upper portion of the bit line 146 and the upper portion of the SNC 138 may be further removed, thereby reducing the entire height of the semiconductor memory device and securing the electrical separation between the bit line 146 and the SNC 138.

The method described with reference to FIG. 5 removes the upper portion of the first conductive layer 136 simultaneously with the removal of the upper portion of the second conductive layer 144, thereby omitting operation S60 of removing the upper portion of the first conductive layer 136 shown in FIG. 2. Omitting operation S60 thereby results in reductions in the manufacturing time and cost.

Figure 7:
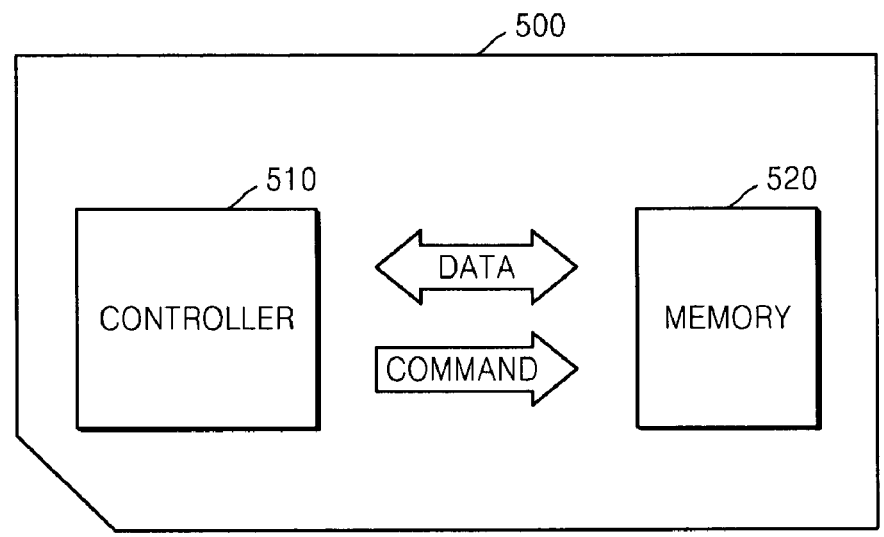
FIG. 7 is a schematic diagram roughly illustrating a memory card according to still another example embodiment.
Figure 8:
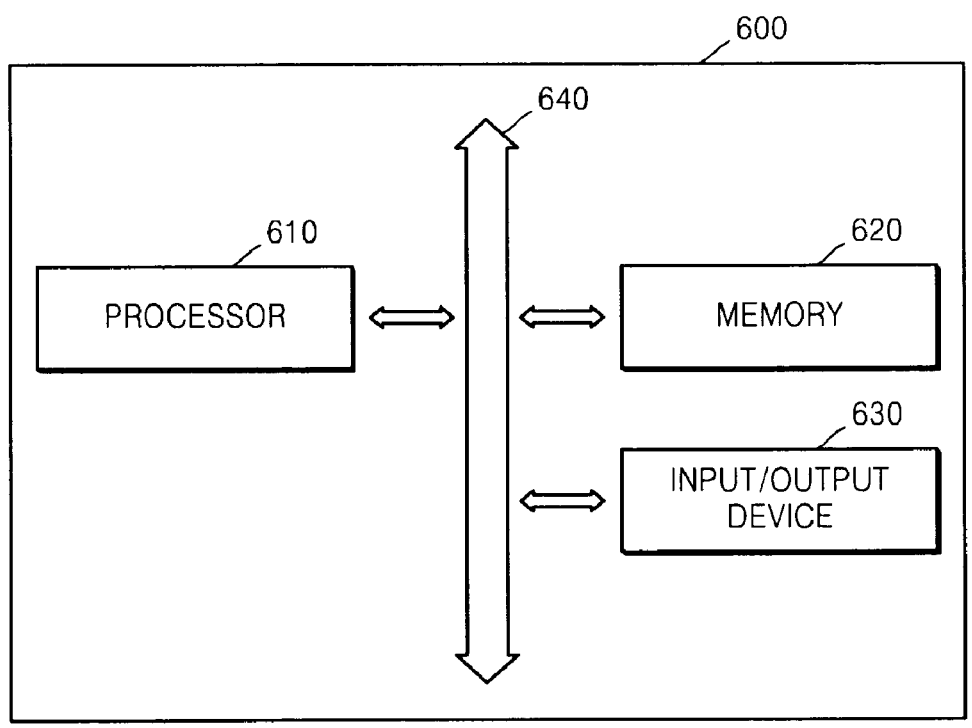
FIG. 8 is a block diagram roughly illustrating an electronic system according to a yet further example embodiment.

FIG. 7 is a schematic diagram roughly illustrating a memory card according to still another example embodiment. FIG. 8 is a block diagram roughly illustrating an electronic system according to a further example embodiment.

Referring to FIG. 7, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1 through 6.

Such a memory card 500 may be used as a storage medium for various portable electronic devices. For example, the memory card 500 may be a multimedia card (MMC) or a secure digital (SD) card.

Referring to FIG. 8, a processor 610, an input/output device 630 and a memory 620 may perform data communication with each other by using a bus 640. The processor 610 may execute a program and control the electronic system 600. The input/output device 630 may be used to input/output data to/from the electronic system 600. The electronic system 600 may be connected to an external device (e.g., a personal computer or a network) by using the input/output device 630 and may exchange data with the external device.

The memory 620 may store codes or programs for operations of the processor 610. For example, the memory 620 may include one of the memory devices described above in reference to FIGS. 1 through 6.

For example, such an electronic system 600 may embody various electronic control systems requiring the memory 620, and, for example, may be used in mobile devices (e.g., mobile phones, MP3 players, navigation devices or similar devices), solid state disks (SSD), household appliances or personal computers (PC).

While the inventive concepts has been particularly shown and described with reference to example embodiments thereof, it will be understood that various changes in form and details may be made therein without departing from the spirit and scope of the following claims.

What is claimed is:

1. A method of manufacturing a semiconductor memory device, the method comprising:
    forming a first insulation layer over a semiconductor substrate in which a first region and a second region are defined;
    forming a bit line contact over the second region through the first insulation layer;
    forming a second insulation layer over the first insulation layer and the bit line contact;
    patterning the second insulation layer and the first insulation layer such that the first region is exposed;
    depositing a first conductive layer on the exposed first region and the second insulation layer;
    forming a storage node contact (SNC) electrically connected to the first region by removing an upper portion of the first conductive layer such that the second insulation layer is exposed;
    patterning the second insulation layer such that the bit line contact is exposed;
    depositing a second conductive layer over the exposed bit line contact, the SNC and the second insulation layer; and
    forming a bit line, electrically connected to the second region through the bit line contact, by removing an upper portion of the second conductive layer such that the SNC and the second insulation layer are exposed; wherein the upper portion of the second conductive layer is removed using a chemical mechanical polishing (CMP) process; and wherein an upper portion of the SNC and an upper portion of the second insulation layer are removed by using the CMP process such that remaining parts of the SNC and the second conductive layer are electrically separated from each other.

2. The method of claim 1, wherein the semiconductor substrate comprises:
    an active region including the first region and the second region;
    a device isolation layer that defines the active region; and
    a gate line recessed into the active region of the device isolation layer and passes between the first region and the second region.

3. The method of claim 1, wherein the semiconductor substrate comprises:
    an active region including a first impurity region and a second impurity region;
    a device isolation layer that defines the active region;
    a gate line formed on the active region of the device isolation layer and passes between the first impurity region and the second impurity region;
    a lower insulation layer formed over the active region, the device isolation layer and the gate line; and
    first and second self-alignment contacts that pass through the lower insulation layer and are electrically connected to the first impurity region and the second impurity region, respectively,
    wherein the first region and the second region are upper portions of the first and second self-alignment contacts, respectively.

4. The method of claim 1, wherein the SNC is used as a mask when the second insulation layer is patterned to expose the bit line contact.

5. The method of claim 1, wherein the second insulation layer and the first insulation layer are inclinedly etched so that an upper cross-section of the SNC is greater than a lower cross-section thereof when the second insulation layer and the first insulation layer are patterned to expose the first region, and
    the second insulation layer is inclinedly etched so that an upper cross-section of the bit line is greater than a lower cross-section thereof when the second insulation layer is patterned to expose the bit line contact.

6. The method of claim 1, wherein the exposed SNC and the second conductive layer are electrically connected to each other prior to the removal of the upper portion of the SNC and the upper portion of the second insulation layer.

7. The method of claim 1, further comprising:
    forming a third insulation layer over the second insulation layer, the bit line and the SNC; and
    forming a landing plug over the SNC through the third insulation layer.

8. A method of manufacturing a semiconductor memory device, the method comprising:
- forming a first insulation layer over a semiconductor substrate in which a first region and a second region are defined;
- forming a bit line contact over the second region through the first insulation layer;
- forming a second insulation layer over the first insulation layer and the bit line contact;
- patterning the second insulation layer and the first insulation layer such that the first region is exposed;
- depositing a first conductive layer on the exposed first region and the second insulation layer;
- patterning the first conductive layer and the second insulation layer such that the bit line contact is exposed;
- depositing a second conductive layer over the exposed bit line contact and the first conductive layer; and
- forming a storage node contact (SNC) and a bit line by removing an upper portion of the second conductive layer and an upper portion of the first conductive layer such that the second insulation layer is exposed, the SNC being electrically connected to the first region and being a remaining part of the first conductive layer, and the bit line being electrically connected to the second region through the bit line contact and being a remaining part of the second conductive layer; wherein the SNC and the bit line are simultaneously formed.

9. A method of manufacturing a semiconductor memory device, comprising:
- forming an insulation layer over a semiconductor substrate in which a first region and a second region are defined;
- forming a storage node contact (SNC) electrically connected to the first region;
- depositing a conductive layer, that passes through the insulation layer and is electrically connected to the second region, over the insulation layer and the SNC; and
- forming a bit line by removing an upper portion of the conductive layer such that the SNC and the conductive layer are electrically separated from each other, the bit line being electrically connected to the second region;
- wherein the SNC and the conductive layer are electrically connected to each other prior to the removal of the upper portion of the conductive layer.

10. The method of claim 9, wherein the formation of the SNC comprises:
- forming a bit line contact over the second region through a first insulation layer;
- forming a second insulation layer over the first insulation layer and the bit line contact, the insulation layer including the first and second insulation layer;
- patterning the second insulation layer and the first insulation layer such that the first region is exposed;
- depositing a first conductive layer over the exposed first region and the second insulation layer; and
- forming the SNC by removing an upper portion of the first conductive layer such that the second insulation layer is exposed.

11. The method of claim 10, further comprising patterning the second insulation layer until the bit line contact is exposed, after formation of the SNC and prior to deposition of the conductive layer over the insulation layer and the SNC.

12. The method of claim 10, wherein the deposition of the conductive layer over the insulation layer and the SNC comprises depositing a second conductive layer over the exposed bit line, the SNC and the second insulation layer, and
- the formation of the bit line comprises removing an upper portion of the second conductive layer until the SNC and the second insulation layer are exposed, the bit line being electrically connected to the second region through the bit line contact.

13. The method of claim 9, wherein the bit line is a remaining part of the conductive layer after removing the upper portion of the conductive layer.

* * * * *